United States Patent [19]
Smith et al.

[11] Patent Number: 5,959,354
[45] Date of Patent: Sep. 28, 1999

[54] CONNECTION COMPONENTS WITH ROWS OF LEAD BOND SECTIONS

[75] Inventors: John W. Smith, Palo Alto; Thomas H. DiStefano, Monte Sereno, both of Calif.

[73] Assignee: Tessera, Inc., San Jose, Calif.

[21] Appl. No.: 09/057,125

[22] Filed: Apr. 8, 1998

Related U.S. Application Data

[60] Division of application No. 08/678,808, Jul. 12, 1996, Pat. No. 5,830,782, which is a continuation-in-part of application No. 08/440,665, May 15, 1995, Pat. No. 5,801,441, which is a division of application No. 08/271,768, Jul. 7, 1994, Pat. No. 5,518,964
[60] Provisional application No. 60/001,782, Aug. 2, 1995.

[51] Int. Cl.$^6$ ........................... H01L 23/12; H01L 23/48; H01L 23/36
[52] U.S. Cl. ........................... 257/734; 257/48; 257/620; 257/696; 257/698; 257/691; 257/202; 257/203; 257/208; 257/210
[58] Field of Search ........................... 257/734, 620, 257/690, 691, 693, 724, 207, 208–211, 48, 202, 203, 797, 666, 674, 673, 696, 698

[56] References Cited

U.S. PATENT DOCUMENTS

| | | | |
|---|---|---|---|
| 3,373,481 | 3/1968 | Lins et al. | |
| 3,795,037 | 3/1974 | Luttmer | 174/52.3 |
| 3,811,186 | 5/1974 | Larnerd et al. | 438/117 |
| 3,825,353 | 7/1974 | Loro | 257/735 |
| 3,842,189 | 10/1974 | Southgate | 257/712 |
| 3,952,404 | 4/1976 | Matunami | 257/735 |
| 4,067,104 | 1/1978 | Tracy | 257/448 |
| 4,142,288 | 3/1979 | Flammer et al. | 257/784 |
| 4,326,663 | 4/1982 | Oettel | 228/123.1 |
| 4,447,857 | 5/1984 | Marks et al. | 361/739 |
| 4,520,562 | 6/1985 | Sade et al. | 29/878 |
| 4,629,957 | 12/1986 | Walters et al. | 257/418 |

(List continued on next page.)

FOREIGN PATENT DOCUMENTS

| | | |
|---|---|---|
| 0072673A2 | 2/1983 | European Pat. Off. . |
| 0352 020 | 1/1990 | European Pat. Off. . |
| 0433 997 | 6/1991 | European Pat. Off. . |
| 3-108734 | of 0000 | Japan . |
| 3-198734 | of 0000 | Japan . |
| 61-91939 | 5/1986 | Japan . |
| A 01-155633 | 6/1989 | Japan . |
| A 03-108734 | 5/1991 | Japan . |
| 2151529 | 7/1985 | United Kingdom . |
| 2142568 | 1/1989 | United Kingdom . |
| WO 94/03036 | 2/1994 | WIPO . |
| WO 96/02068 | 1/1996 | WIPO . |

OTHER PUBLICATIONS

"Method of Testing Chips and Joining Chips to Substrates", Research Disclosure, Feb. 1991, No. 322, Kenneth Mason Publication Ltd., England.

IBM Technical Disclosure Bulletin, vol. 36, No. 07, Jul. 1993.

*Primary Examiner*—Alexander Oscar Williams
*Attorney, Agent, or Firm*—Lerner, David, Littenberg, Krumholz & Mentlik, LLP

[57] ABSTRACT

A connection component for a microelectronic element includes a sheet-like support structure having top and bottom surfaces which extend in horizontal directions. The support structure includes a central region and a periphery surrounding the central region with terminals mounted on the central region of the support structure and exposed at the top surface thereof. A plurality of leads extend on the support structure with each lead having a terminal section connected to one of the terminals and attached to the bottom surface, a bond region and a horizontally curved section between the bond region and the terminal region. The bond regions of the leads are disposed side-by-side in one or more rows adjacent the periphery of the support structure. After the bond regions of the leads have been bonded to contacts of a microelectronic element, the support structure of the connection component is moveable upwardly so as to bend the curved sections of the leads.

6 Claims, 6 Drawing Sheets

U.S. PATENT DOCUMENTS

| | | | |
|---|---|---|---|
| 4,661,192 | 4/1987 | McShane | 257/705 |
| 4,667,219 | 5/1987 | Lee et al. | 257/693 |
| 4,721,995 | 1/1988 | Tanizawa | 257/777 |
| 4,751,199 | 6/1988 | Phy | 257/669 |
| 4,785,137 | 11/1988 | Samuels | 257/741 |
| 4,793,814 | 12/1988 | Zifcak et al. | 439/66 |
| 4,812,191 | 3/1989 | Ho et al. | 156/239 |
| 4,893,172 | 1/1990 | Matsummoto et al. | 257/668 |
| 4,926,241 | 5/1990 | Carey | 257/786 |
| 4,949,158 | 8/1990 | Ueda | 257/774 |
| 4,954,877 | 9/1990 | Nakkanishi et al. | 257/698 |
| 4,955,523 | 9/1990 | Calomagno et al. | 29/837 |
| 5,047,830 | 9/1991 | Grabbe | 257/692 |
| 5,049,085 | 9/1991 | Reylek et al. | 439/91 |
| 5,055,907 | 10/1991 | Jacobs | 257/786 |
| 5,057,460 | 10/1991 | Rose | 257/679 |
| 5,067,007 | 11/1991 | Kanji et al. | 257/698 |
| 5,086,337 | 2/1992 | Noro et al. | 257/692 |
| 5,131,852 | 7/1992 | Grabbe et al. | 439/71 |
| 5,148,266 | 9/1992 | Khandros et al. | 257/773 |
| 5,152,695 | 10/1992 | Grabbe et al. | 439/71 |
| 5,166,099 | 11/1992 | Ueda et al. | 257/668 |
| 5,173,055 | 12/1992 | Grabbe | 439/66 |
| 5,192,716 | 3/1993 | Jacobs | 438/15 |
| 5,197,892 | 3/1993 | Yoshizawa et al. | 439/91 |
| 5,210,939 | 5/1993 | Mallik et al. | 438/125 |
| 5,230,931 | 7/1993 | Yamazaki et al. | 427/569 |
| 5,254,811 | 10/1993 | Ludden et al. | 174/258 |
| 5,286,680 | 2/1994 | Cain | 29/827 |
| 5,346,861 | 9/1994 | Khandros et al. | 438/15 |
| 5,455,390 | 10/1995 | DiStefano et al. | 361/749 |
| 5,518,964 | 5/1996 | DiStefano et al. | 438/113 |
| 5,528,083 | 6/1996 | Malladi et al. | 257/786 |
| 5,597,470 | 1/1997 | Karavakis et al. | 205/118 |
| 5,629,239 | 5/1997 | DiStefano et al. | 438/111 |

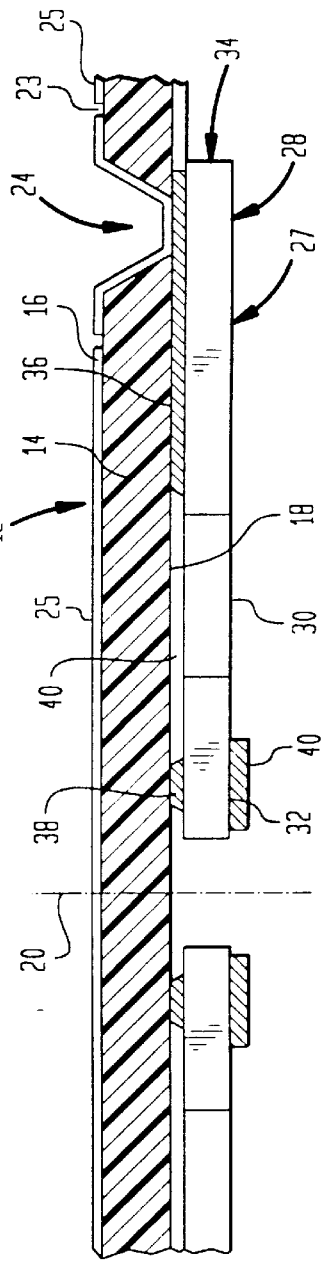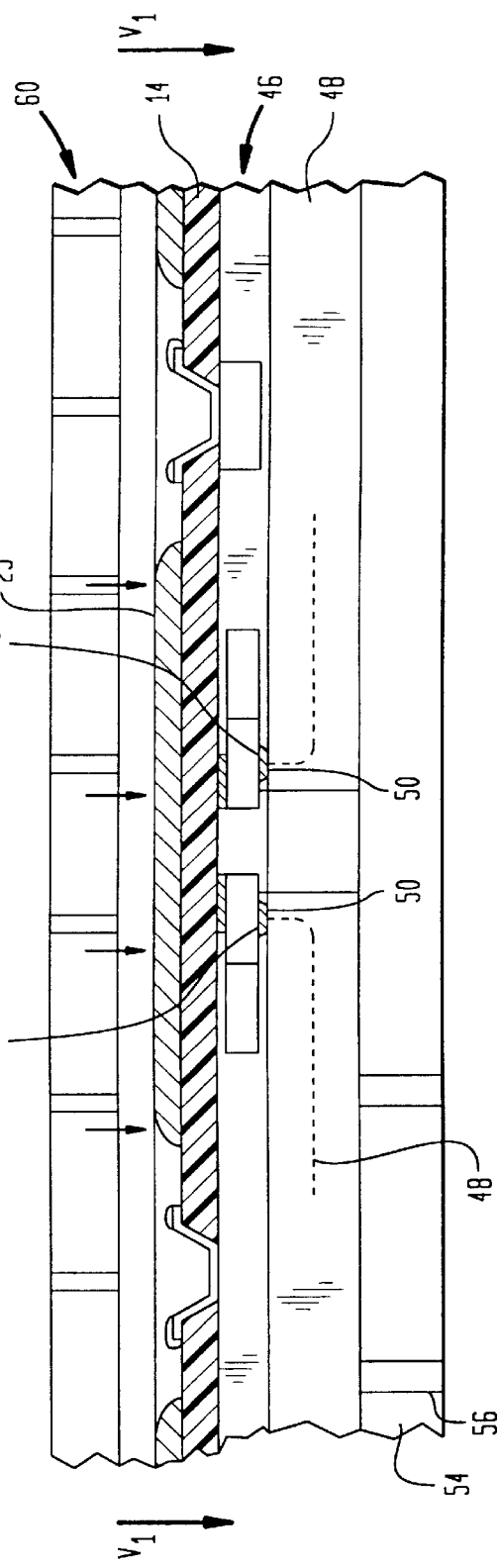

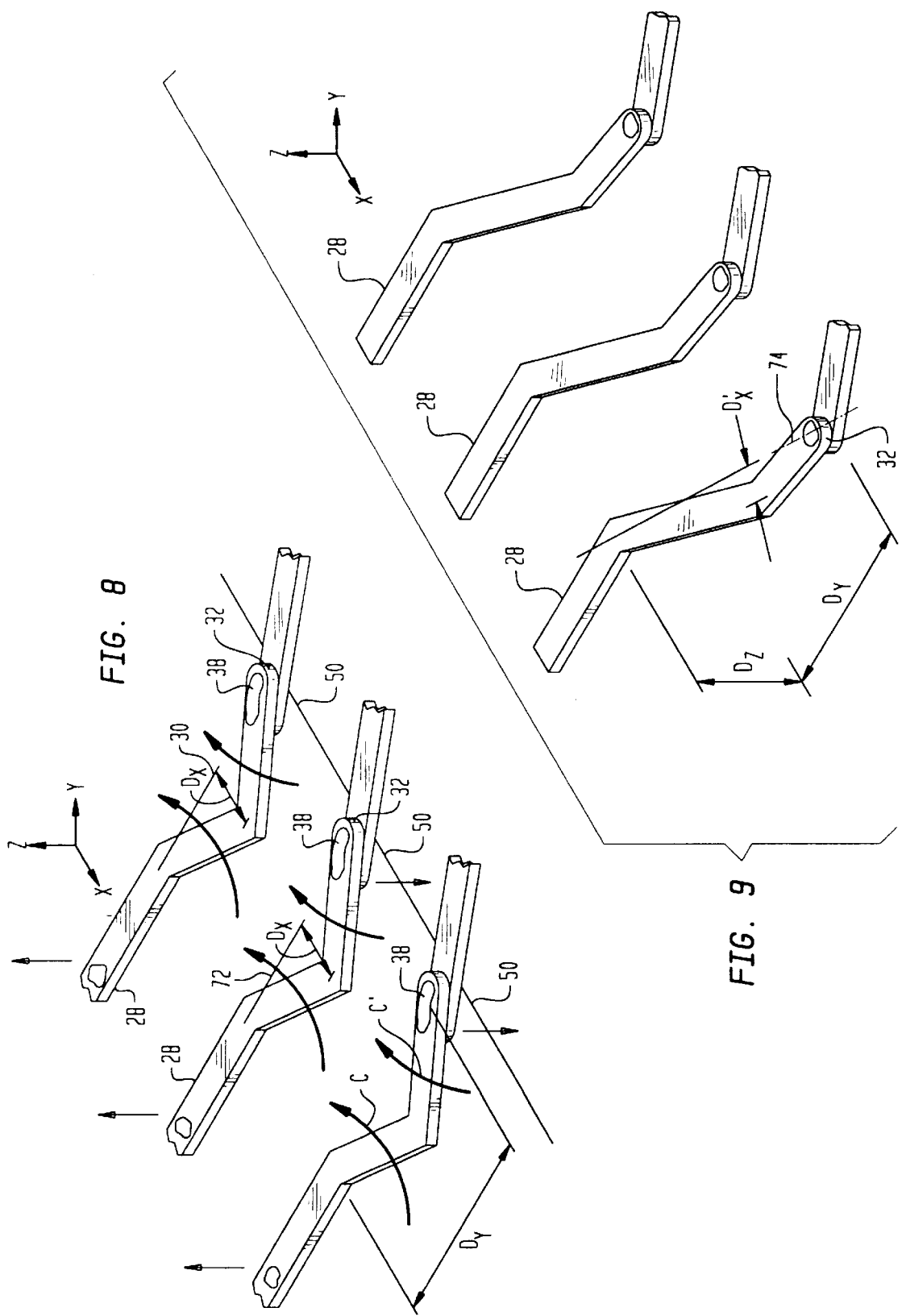

CONNECTION COMPONENTS WITH ROWS OF LEAD BOND SECTIONS

CROSS REFERENCE TO RELATED APPLICATIONS

The present application is a Divisional of U.S. patent application Ser. No. 08/678,808 now U.S. Pat. No. 5,836,782 filed Jul. 12, 1996 which in turn is a continuation-in-part of U.S. patent application Ser. No. 08/440,665 filed May 15, 1995, no U.S. Pat. No. 5,801,441 which in turn is a divisional of U.S. patent application Ser. No. 08/271,768, filed Jul. 7, 1994, now U.S. Pat. No. 5,518,964, the disclosure of which is hereby incorporated by reference herein. This application claims the benefit of U.S. Provisional Application No. 60/001,782, filed Aug. 2, 1995.

FIELD OF THE INVENTION

The present invention relates to mounting and connection devices and techniques for use with microelectronic elements such as semiconductor chips.

BACKGROUND OF THE INVENTION

Complex microelectronic devices such as modern semiconductor chips require numerous connections to other electronic components. For example, a complex microprocessor chip may require many hundreds of connections to external devices.

Semiconductor chips commonly have been connected to electrical traces on mounting substrates by one of three methods: wire bonding, tape automated bonding, and flip-chip bonding. In wire bonding, the chip is positioned on a substrate with a bottom or back surface of the chip abutting the substrate and with the contact-bearing front or top surface of the chip facing upwardly, away from the substrate. Individual gold or aluminum wires are connected between the contacts on the chip and pads on the substrate. In tape automated bonding a flexible dielectric tape with a prefabricated array of leads thereon is positioned over the chip and substrate and the individual leads are bonded to the contacts on the chip and to pads on the substrate. In both wire bonding and conventional tape automated bonding, the pads on the substrate are arranged outside of the area covered by the chip, so that the wires or leads fan out from the chip to the surrounding pads. The area covered by the subassembly as a whole is considerably larger than the area covered by the chip. This makes the entire assembly substantially larger than it otherwise would be. Because the speed with which a microelectronic assembly can operate is inversely related to its size, this presents a serious drawback. Moreover, the wire bonding and tape automated bonding approaches are generally most workable with chips having contacts disposed in rows extending along the periphery of the chip. They generally do not lend themselves to use with chips having contacts disposed in a so-called area array, i.e., a grid-like pattern covering all or a substantial portion of the chip front surface.

In the flip-chip mounting technique, the contact bearing surface of the chip faces towards the substrate. Each contact on the chip is joined by a solder bond to the corresponding pad on the substrate, as by positioning solder balls on the substrate or chip, juxtaposing the chip with the substrate in the front-face-down orientation and momentarily melting or reflowing the solder. The flip-chip technique yields a compact assembly, which occupies an area of the substrate no larger than the area of the chip itself. However, flip-chip assemblies suffer from significant problems with thermal stress. The solder bonds between the chip contacts and substrate are substantially rigid. Changes in the size of the chip and of the substrate due to thermal expansion and contraction in service create substantial stresses in these rigid bonds, which in turn can lead to fatigue failure of the bonds. Moreover, it is difficult to test the chip before attaching it to the substrate, and hence difficult to maintain the required outgoing quality level in the finished assembly, particularly where the assembly includes numerous chips.

Numerous attempts have been made to solve the foregoing problem. Useful solutions are disclosed in commonly assigned U.S. Pat. Nos. 5,148,265 and 5,148,266. Preferred embodiments of the structures disclosed in these patents incorporate flexible, sheet-like structures referred to as "interposers" or "chip carriers." The preferred chip carriers have a plurality of terminals disposed on a flexible, sheet-like top layer. In use, the interposer is disposed on the front or contact bearing surface of the chip with the terminals facing upwardly, away from the chip. The terminals are then connected to the contacts of the chip. Most preferably, this connection is made by bonding prefabricated leads on the interposer to the chip contacts, using a tool engaged with the lead. The completed assembly is then connected to a substrate, as by bonding the terminals of the chip carrier to the substrate. Because the leads and the dielectric layer of the chip carrier are flexible, the terminals on the chip carrier can move relative to the contacts on the chip without imposing significant stresses on the bonds between the leads and the chip, or on the bonds between the terminals and the substrate. Thus, the assembly can compensate for thermal effects. Moreover, the assembly most preferably includes a compliant layer disposed between the terminals on the chip carrier and the face of the chip itself as, for example, an elastomeric layer incorporated in the chip carrier and disposed between the dielectric layer of the chip carrier and the chip. Such a compliant structure permits displacement of the individual terminals independently towards the chip. This permits effective engagement between the subassembly and a test fixture. Thus, a test fixture incorporating numerous electrical contacts can be engaged with all of the terminals in the subassembly despite minor variations in the height of the terminals.

The subassembly can be tested before it is bonded to a substrate so as to provide a tested, known, good part to the substrate assembly operation. This in turn provides very substantial economic and quality advantages.

Copending, commonly assigned U.S. patent application Ser. No. 08/190,779 describes a further improvement. Components according to preferred embodiments of the '779 application use a flexible, dielectric top sheet having top and bottom surfaces. A plurality of terminals is mounted on the top sheet. A support layer is disposed underneath the top sheet, the support layer having a bottom surface remote from the top sheet. A plurality of electrically conductive, elongated leads are connected to the terminals on the top sheet and extend generally side by side downwardly from the terminals through the support layer. Each lead has a lower end at the bottom surface of the support layer. The lower ends of the leads have conductive bonding materials as, for example, eutectic bonding metals. The support layer surrounds and supports the leads.

Components of this type can be connected to microelectronic elements such as semiconductor chips or wafers by juxtaposing the bottom surface of the support layer with the contact-bearing surface of the chip so as to bring the lower ends of the leads into engagement with the contacts on the chip, and then subjecting the assembly to elevated temperature and pressure conditions. All of the lower ends of the leads bond to the contacts on the chip substantially simultaneously. The bonded leads connect the terminals of the top sheet with the contacts on the chip. The support layer desirably is either formed from a relatively low-modulus, compliant material, or else is removed and replaced after the lead bonding step with such a compliant material. In the finished assembly, the terminals desirably are movable with respect to the chip to permit testing and to compensate for thermal effects. However, the components and methods of the '779 application provide further advantages, including the ability to make all of the bonds to the chip or other component in a single lamination-like process step. The components and methods of the '779 application are especially advantageous when used with chips or other microelectronic elements having contacts disposed in an area array.

Certain preferred methods according to the aforementioned Ser. No. 08/271,768 application include the steps of providing a first element having a first surface with a plurality of elongated, flexible leads extending along the first surface, each such lead having a terminal end attached to the first element and a tip end offset from the terminal end in a horizontal direction parallel to the first surface. These preferred methods also include the step of simultaneously forming all of the leads by moving all of the tip ends of the leads relative to the terminal ends thereof and relative to the first element so as to bend the tip ends away from the first element. Desirably, the tip ends of all the leads are attached to a second element, and the step of moving the tip ends of the lead relative to the terminal ends of the leads includes the step of moving the second element relative to the first element. The first and second elements desirably move in a vertical direction, away from one another, and may also move in horizontal directions parallel to the surfaces of the elements so as to bend the tip end of each lead horizontally towards its own terminal end and vertically away from the terminal end. The net effect is to deform the leads towards formed positions in which the leads extend generally vertically downwardly, away from the first element. Methods according to this aspect of the '768 invention may further include the step of injecting a flowable, desirably compliant dielectric material around the leads after the lead-forming step and then curing the flowable material so as to form a dielectric support layer around the leads.

In particularly preferred methods according to the '768 application, one element is a flexible, dielectric top sheet having terminal structures thereon, and the other element includes one or more semiconductor chips. The resulting assembly thus includes the dielectric sheet with the terminal structures connected to the contacts of the chip or chips by the vertically-extending, curved flexible leads, the sheet being spaced apart from the chip or chips by the dielectric layer. The terminal structures can be connected to a substrate such as a circuit panel to thereby provide electrical connections to the contacts of the chip. Each terminal structure is movable with respect to the chip in horizontal directions parallel to the chip, to take up differences in thermal expansion between the chip and substrate, as well as in vertical directions towards and away from the chip, to facilitate testing and assembly. In these respects, the resulting assembly provides advantages similar to those achieved by preferred assemblies according to the aforementioned U.S. Pat. Nos. 5,148,265 and 5,148,266.

In the preferred processes of the '768 application, one element may be a multi-chip unit such as a wafer incorporating a plurality of semiconductor chips having contacts thereon and the other element may be a dielectric sheet extending over a plurality of these chips so that the sheet includes a plurality of regions, one such region corresponding to each such chip. In this arrangement, the step of attaching the tip ends of the leads to the second element preferably includes the step of bonding the tip ends of leads in a plurality of such regions, and desirably in all of such regions, to the contacts on the chips or to the terminal structures on the sheet simultaneously so that each such region is connected to one chip. The method may further include the steps of injecting a flowable dielectric material between the wafer and the sheet and curing the dielectric material to form a compliant dielectric support layer during or after the moving step, and subsequently severing the chips from the multichip element or wafer and severing the regions from the sheet so as to form individual units, each including a chip and the associated region of the sheet.

The step of attaching the tip ends of the leads to the second element desirably includes the step of bonding the tip ends of the leads to the contacts on the chip or to the terminal structures of the dielectric sheet while the leads are in their initial, undeformed positions. Thus, all of the tip ends are bonded simultaneously to the chip contacts or to the terminal structures on the dielectric sheet. A single simultaneous bonding operation may bond thousands of leads. Because the leads are in their initial, undeformed positions when bonded to the contacts, the positions of the lead tips are well controlled at this stage. This facilitates registration of the lead tips with the terminal structures or contacts.

Despite these and other advances in the art, still further improvements would be desirable.

SUMMARY OF THE INVENTION

One aspect of the present invention provides methods of making one or more microelectronic assemblies. Preferred methods according to this aspect of the invention include the step of providing one or more microelectronic elements, each having a front surface and a plurality of contacts on the front surface, and also providing one or more connection components each including a support structure such as a sheetlike dielectric support structure having major surfaces extending in horizontal planes. The support structure or sheet also has leads extending across the sheet from the terminals. Each lead has a terminal region adjacent the terminal secured to the sheet or support structure, a horizontally curved portion and a bond region, the curved portion being disposed at least in part between the bond region and the terminal portion. The bond regions and the curved portions of the leads desirably are arranged in rows, so that the bond regions of the leads constituting each such row are disposed side-by-side, and so that the curved portions of the leads in each such row are nested in one another.

The method further includes the step of juxtaposing one such connection component with each microelectronic element so that the exposed sections of the leads on each connection component overly the contacts on the front surface of the associated microelectronic element. That is, each microelectronic element has its contacts disposed in rows corresponding to the rows of lead bond regions. For example, each microelectronic element may be a semiconductor chip of the type having a row of contacts adjacent each edge of the chip.

The method further includes the step of bonding the bond regions of the leads to the contacts, and then, after the bonding step, moving the support structure of each connection component upwardly away from the associated microelectronic element. As further discussed below, this upward movement causes bending of the leads to a formed configuration in which each lead extends upwardly away from the microelectronic element. The sections of the leads which were originally curved in the horizontal plane are reformed to extend in the vertical directions.

Each connection component typically has several rows of leads. These rows may be arranged in a rectilinear pattern corresponding to the rows of contacts on the chip.

In an alternate arrangement, the leads of each connection component may extend beyond the support structure, so that a section of the lead, including the bond region and, preferably, the curved section of each lead, is exposed. Thus, each sheetlike support structure may be formed as a portion of a larger sheet with a ring of securement elements surrounding the sheet, so that the sheet and the securement elements cooperatively define elongated slots therebetween. Each row of leads may be aligned with one such slot, the bond region and curved region of each lead in the row extending across the slot. Each lead may also have a tip end detachably secured to the securement element, so that the securement element and support structure cooperatively retain the bond region of the lead in position prior to the bonding step. The bonding step may include the step of advancing a tool into each such slot and moving the tool along the slot so as to successively bond the bond sections of the leads. Alternatively, multiple leads may be bonded simultaneously as, for example, by application of heat and/or pressure to the assembly after the juxtaposing step. In either case however, when the support structure is moved upwardly, all of the leads are deformed simultaneously.

As the support structure is moved upwardly, away from the microelectronic element or chip, a space is provided between the support structure and the front surface of the component. Preferably, the method further includes the step of filling this space with a compliant, flexible material such as an elastomer as, for example, by introducing the elastomer in liquid form and then curing the elastomer. The resulting assembly includes the support structure or dielectric sheet with terminals thereon spaced apart from the microelectronic element or chip.

The flexible leads and flexible dielectric sheet or support structure cooperatively permit movement of the terminals relative to the contacts on the chip or microelectronic element, whereas the same components in conjunction with the compliant or elastomeric layer permit movement of the terminals relative towards and away from the component in the vertical or Z direction and thus facilitate testing of the assembly. These advantages are similar to those described in the aforementioned U.S. Pat. Nos. 5,148,265 and 5,148,266. Preferred methods according to the present invention can be used to produce assemblies having a "fan-in" arrangement as taught in the aforementioned '265 patent, wherein the dielectric sheet or support structure bearing the terminals overlies a central region of the chip surface and leads extend inwardly from contacts adjacent to the periphery of the chip to such terminals.

Most preferably, the connection components are provided as portions of a larger, sheetlike assembly article in which many connection components are disposed side-by-side in an array. The support structures of all of the components and, preferably, the securement elements as well may be formed as portions of a unitary, dielectric sheet. The step of providing the microelectronic elements may include the step of providing a chip assembly incorporating a plurality of chips, the front or contact-bearing surfaces of the chips being substantially co-planar. Thus, all of the connection components and microelectronic elements can be juxtaposed with one another by juxtaposing the unitary sheet with the chip assembly. The chip assembly may be either a wafer incorporating a plurality of chips or an assembly of plural or separate chips on a backing element. After the juxtaposing, bonding and moving steps, and desirably after introduction of a compliant material as aforesaid, the unitary sheet is severed and the chip assembly is disassembled to form a plurality of units, each including one chip and the associated connection component. The support structures of the various connection components may, initially, be connected to one another at least in part by the leads associated with the components and the severing step may serve to break this connection. Where the connection components are provided in a unitary sheet, the method desirably includes the step of severing the connection components from one another, and also detaching the chips from one another, as by cutting the sheet and wafer to separate the resulting assemblies from one another.

Further aspects of the present invention provide connection components. Each such connection component desirably incorporates a support structure such as a dielectric sheet and a plurality of leads extending along a surface of the sheet. The component further includes terminals mounted on a surface of the sheet. Most desirably, the terminals are mounted on a top surface of the sheet whereas the leads extend along a bottom surface facing oppositely from the top surface, each such lead being connected to one terminal as by a via or similar structure extending through the sheet. Each lead desirably includes a trace section or terminal section connected to the terminal and secured to the surface of the sheet, and further includes a horizontally curved section and a bond section, the curved section of each lead being disposed between the bond section and the trace section. Desirably, the bond section of each lead is detachably secured to the surface of the support structure, whereas the trace section is permanently secured to the surface. The curved section may be either unsecured to the surface or detachably secured to the surface.

The leads are arranged so that the bond sections are disposed in rows, the bond sections of the leads in each such row being side-by-side adjacent to one another. The curved sections of the leads in each such row are side-by-side and nested in one another. The bond section of each lead may have a bonding material thereon, to bond with the materials of the microelectronic element contacts under heat and pressure. Connection components according to this aspect of the invention may be provided in a tape or, preferably, as an assembly article incorporating a two-dimensional array of connection components on a continuous sheet. Such an article may be provided with a rigid frame so that the frame maintains the sheet in tension for precise positioning.

According to a further aspect of the invention, the curved section of each lead may extend beyond the support structure of the connection component. Where plural connection components are provided in a sheet, the sheet may incorporate slots or bond windows encircling the support structure of each connection component, so that each such support structure is connected to the remainder of the sheet, and to the neighboring support structures by the leads themselves. Such a sheet may incorporate strip-like securement sections extending between each pair of adjacent support structures. In this arrangement, the bond region of each lead may be detachably or permanently secured to one such securement section. As further discussed below, components according to this aspect of the present invention can be used in variants of the processes described above as, for example, where a bonding tool is employed to secure the bond sections to the contacts or where the securement sections are left in place when the support structures are moved away from the microelectronic elements.

These and other objects, features and advantages of the present invention will be more readily apparent from the detailed description of the preferred embodiments set forth below, taken in conjunction with the accompanying drawings.

BRIEF DESCRIPTION OF THE DRAWINGS

FIG. 3 is a fragmentary, partially sectional view taken along line 3—3 in FIG. 2.

FIG. 6 is a fragmentary, diagrammatic, sectional view depicting the components of FIGS. 1–5 during one stage of the process.

FIGS. 8 and 9 are diagrammatic, perspective views depicting certain leads in the components of FIGS. 1–7 during successive stages of the process.

DETAILED DESCRIPTION OF THE PREFERRED EMBODIMENTS

Figure 1:
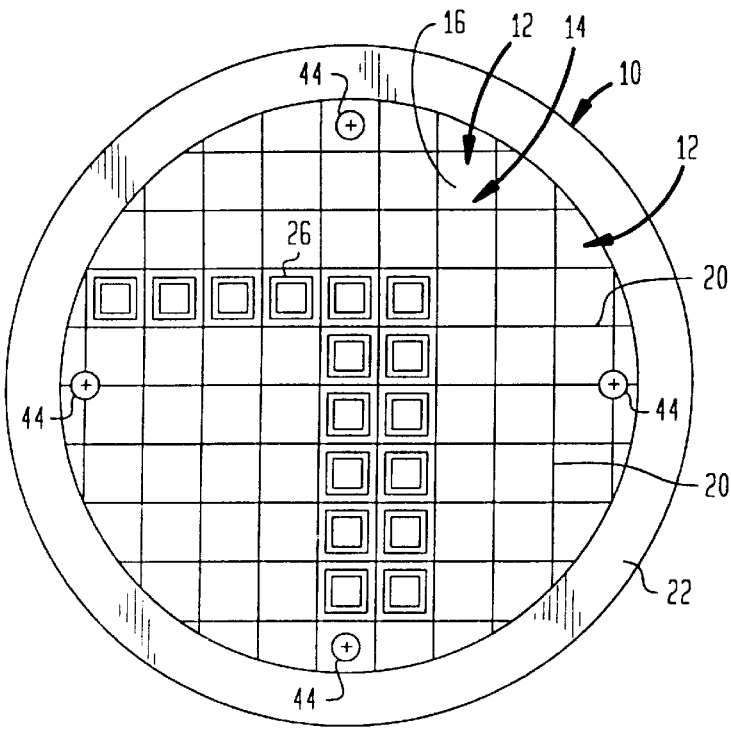
FIG. 1 is a diagrammatic plan view of an assembly article in accordance with one embodiment of the invention.
Figure 2:
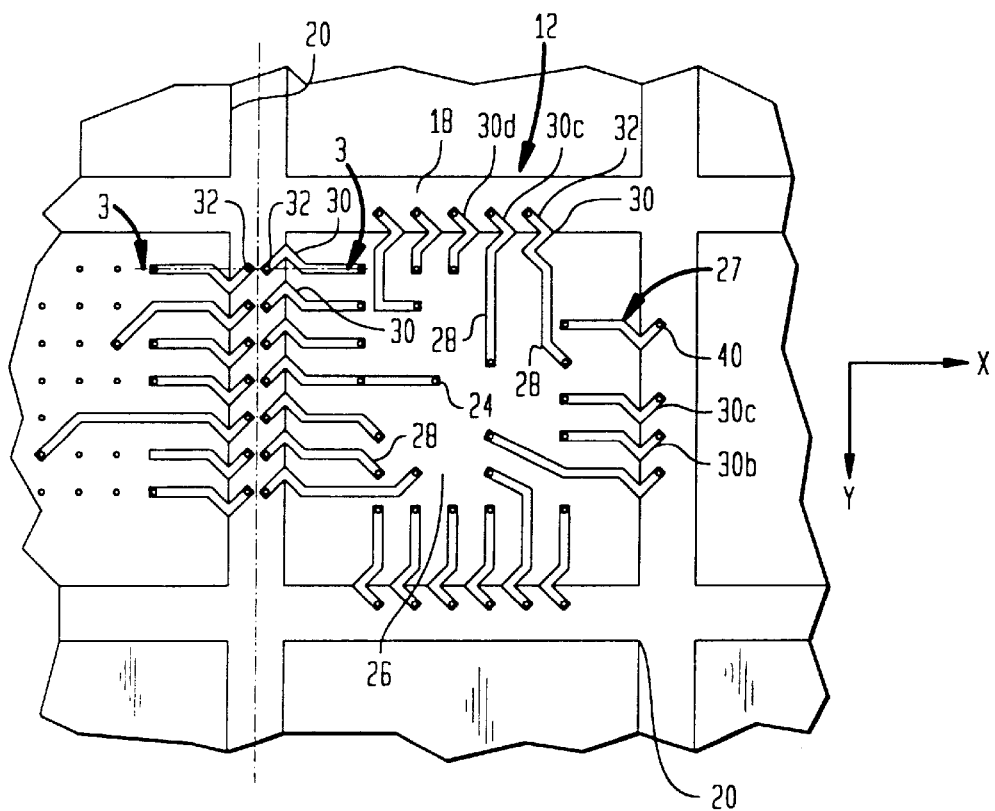
FIG. 2 is a fragmentary view on an enlarged scale of the article illustrated in FIG. 1.
Figure 5:
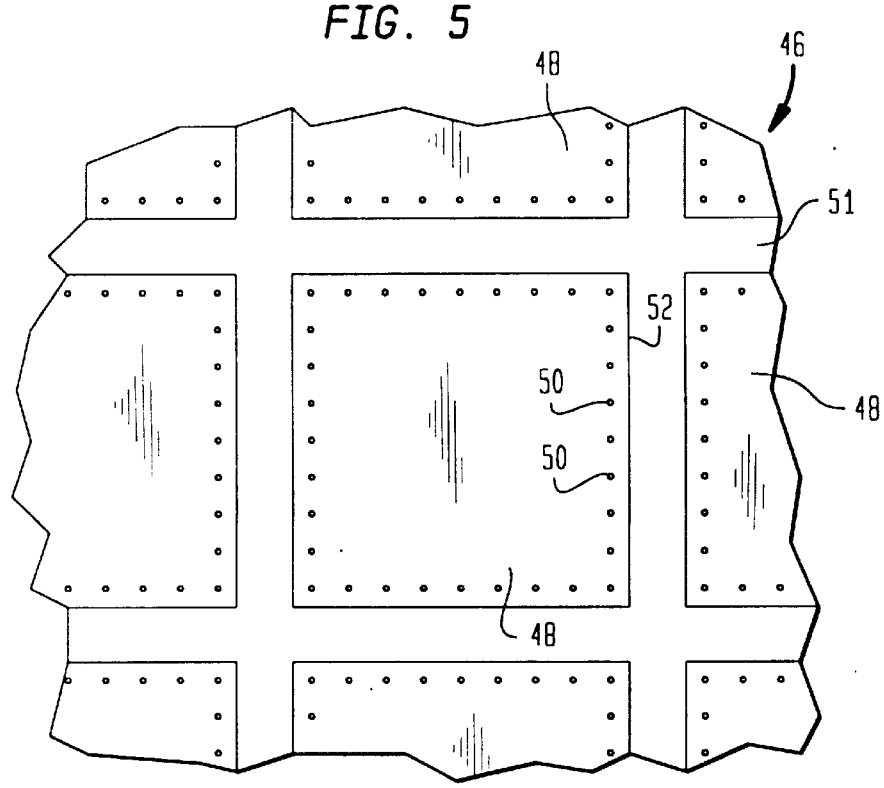
FIG. 5 is a fragmentary, diagrammatic plan view of the wafer shown in FIG. 4.

An assembly article 10 in accordance with one aspect of the present invention includes a plurality of connection components 12, each incorporating a sheetlike support structure 14 having a top surface 16 visible in FIG. 1 and an opposite or bottom surface 18 visible in FIGS. 2 and 3. The support structures of all of the connection components are formed as portions of a single, continuous sheet. Although rectilinear boundaries 20 delimit the individual support structures 12 in the drawings for clarity, the actual boundaries need not be marked by any physical feature of the sheet. The sheet is formed from a flexible but substantially inextensible, dimensionally stable material, such as a polyimide. The sheet may further include flexible but substantially inextensible reinforcing elements extending parallel to its horizontal top and bottom surfaces as, for example, one or more thin sheets of a high-modulus, flexible material such as a metal or glass fibers embedded in the sheet. Desirably, the sheet, and hence each support structure 14 is between about 20 and about 40 microns thick.

An open frame 22 formed from a rigid material such as molybdenum is bonded to the top surface 14 of the sheet at the periphery of the sheet. Frame 22 encircles the sheet and maintains the sheet in a taut condition. Preferably, frame 20 is formed from a metal such as molybdenum which has a linear coefficient of thermal expansion smaller than that of the material constituting the sheet over the temperature ranges employed in the process steps discussed below. In that case, the sheet may be bonded to frame 22 by bringing the sheet and the frame to an elevated temperature, above any sheet temperature to be encountered in other processing steps while stretching the sheet taut, and bonding the two elements together while the sheet is in such taut condition at the elevated temperature. Upon cooling, the sheet tends to contract to a greater degree than the frame, which tends to maintain the sheet in tension. Where the sheet is formed from a polymeric material or other material which may have residual stresses, these should be relieved, as by annealing or otherwise thermally treating the sheet prior to bonding the sheet and frame together. These steps tend to prevent movement of any portion of the sheet relative to the frame. This in turn facilitates the positioning steps discussed below.

Each connection component includes a plurality of terminals 24 exposed on the top surface 16 of the sheetlike support structure. Each terminal is in the form of a hollow, blind via liner extending through the sheetlike support structure to the bottom surface 18. The terminals 24 of each connection component are disposed in an array within a central region 26 of the top surface of such component, remote from the boundaries 20 of the component. Desirably, the terminals are disposed at substantially equal spacing from one another. The center-to-center distance or pitch between adjacent terminals 24 desirably corresponds to a standard contact pitch or a ball grid array as, for example, about 200, 300, 500 or 1000 micron pitch. Each terminal 24 may be formed from copper or other conductive metallic material by conventional hole-forming and electroplating processes. The component also includes a continuous metallic reinforcing and potential plane layer 25 covering the entire top surface of the sheet except in the regions occupied by terminal 24. Layer 25 is electrically isolated from each terminal 24 by a gap 23 encircling each terminal. At a few terminals 24, the gap may be interrupted and the terminal may be connected to the continuous layer, so that the terminal may serve as a potential plane terminal connecting to the continuous layer with external devices. The potential plane layer acts to reinforce the dielectric sheet constituting the support structures 14.

Each connection component further includes a plurality of leads 26 on the bottom surface 18 of the support structure. Each lead includes a terminal region 28 connected to one of the terminals 24, a generally V-shaped region 30 extending from the terminal region and a bond region 32 at the end of the curved region remote from the terminal region. As best seen in FIG. 2, the curved regions 30 and bond regions 32 of the leads are arranged in rows extending along the edges of each connection component, adjacent the boundary 20 thereof. Each row of bond regions 32 is disposed adjacent the neighboring row of bond region 32 on the next connection component, with the boundary 20 extending between such rows, The curved portions in each row are nested in one another. That is, the convex side of curved portion 30a faces toward the concave side of the next curved portion 30b in the same row. Stated another way, the convexities of all of the curved portions in each row point in the same direction. That is, all of the curved sections 30 in each row point in the same direction. For example, curved section 30a and 30b, and the other curve sections in the same row point in the positive Y direction indicated by the axis in FIG. 2, whereas curve sections 30*c* and 30*d*, and the other curved sections in that row, point in the horizontal direction denoted by the positive X-axis.

The terminal regions 28 of the various leads extend inwardly, away from the curved regions, to the terminals 24, each such lead being connected to one terminal 24. The terminal regions of each lead may be straight or curved as desired and as necessary to reach the various terminals without interfering with other adjacent leads. Although only a few leads are illustrated in the drawings, the actual components include numerous leads, typically scores or hundreds of leads.

Each lead is formed as an elongated strip 34 of a first metal, typically gold, extending throughout the length of the lead, from the terminal region to the bond region. This metal strip desirably is between about 5 microns and about 25 microns thick, most preferably about 20 microns thick. As used in this disclosure, references to the "thickness" of features refer to the dimensions in directions transverse to the horizontal lower surface 18 of the support structure, whereas references to the width of lead features refer to dimension parallel to the surface 18 of the support structure and transverse to the length or direction of elongation of the lead. The strip constituting each lead may be between about 15 microns and about 35 microns wide in the curved region 30 of the lead. The strip may be relatively narrow in the curved region of each lead and womewhat wider in the bond region 32 and in the terminal region 28 of each lead.

As best seen in FIG. 3, the terminal region 28 of each lead is secured to the lower surface 18 of the support structure by a securement layer 36 desirably formed from a second or base metal, such as copper, different from the first metal of strip 34. A thin layer of nickel (not shown) may be provided between the first and second metals. A small button 38 formed from the same material as securement layer 36 connects the strip to the lower surface 18 of the support structure in the bond region 32 of the lead. A dot 40 of bonding material overlies the lower surface of the strip in the bond region 32 of each lead. Each Dot of bonding material 40 about 20–50 microns in diameter. The bonding material may be any material capable of bonding the metal of the lead to the contacts of a semiconductor component. Tin and tin alloys are preferred for gold leads. The tin bonding material may be about 10 microns thick, and may be covered by a thin layer of gold serving as an antioxidant.

The leads may be fabricated by providing a continuous layer of the bonding metal such as copper on the lower surface 18 of the dielectric sheet or support structures of the connection components, masking over this continuous layer and plating the strips 34 of the first metal or gold in the proper areas to form the leads, further selectively masking and plating the spots of bonding material 40 and then etching the layer of base metal using the leads themselves as masks. The leads are precisely located on the sheet by using a photographic masking process. Thus, a photosensitive resist is patterned by exposure to light using a precise mask. The unexposed regions are washed away leaving openings for plating of the lead strip material onto the base metal layer. An etchant, such as an HCL; $CUCL_2$ solution attacks the base metal layer in the areas which are not covered by strips 34, thus removing the base metal in these regions and leaving each lead electrically isolated from the other leads. The etchant also attacks the portions of the base metal layer lying between each lead and the lower surface 18 of the dielectric sheet. The etchant removes the base metal between the lead and the sheet in a progressive manner, working inwardly from the edges of the lead.

In the curved region 30 of each lead, where the width of the lead is at a minimum, the etchant breaks through from one side of the lead to the other, entirely removing the base metal and leaving a minute space 40 between the curved region of the lead and the facing lower surface 18 of the support structure. However, because the width of the lead is somewhat greater in the bond region 32 and terminal region 28 of each lead, the base metal layer is not entirely removed in these regions, leaving dot 38 and region 36 beneath the bond and terminal regions of the lead, respectively. The size of dot 38 is selected that adhesion between the dot and the lower surface 18 of the support structure holds the bond region 32 of the lead securely in place during handling. However, the dot is small enough that it has only limited adhesion to the lower surface. Thus, the bond region of each lead can be detached from the support structure by pulling the bond region of the lead downwardly, away from the support structure.

Most preferably, the electroplating and etching steps used to form the leads are performed after the sheet has been assembled to frame 22 (FIG. 1), and while the sheet is held taut by the frame. Thus, each lead may be located precisely in a fixed position on the sheet, and will hold that position throughout the subsequent operations. The terminals 24 and the holes in the sheet which accommodate the terminals may also be formed after the sheet has been assembled to frame 22. Typically, the terminals are formed before the leads. The same steps used to form the leads are also used to form fiducial marks 44 on the sheet, in precise registration with the leads.

In a process according to a further embodiment of the invention, the assembly article 10, including the connection components in a continuous sheet and the frame 22 is juxtaposed with a wafer 46. The wafer includes a large number of individual chip regions 48, each including the elements of a complete semiconductor chip such as conventional electronic devices (not shown). The individual chip regions correspond to the individual connection components or regions 12 of the assembly article. The wafer itself may be a conventional wafer of the type formed in normal semiconductor fabrication processes. The top surface of the wafer defines the front or contact-bearing surface of each chip. Each chip 48 of wafer 46 has a plurality of contacts 50 on the front surface of the chip. The contacts of each chip are disposed in rows, one such row being disposed adjacent each edge boundary 52 of the chip. Unused spaces 51 are provided between adjacent chips of the wafer. Here again, although the boundaries 52 of the individual chips are shown in the drawing, these boundaries need not be delineated by any physical feature of the wafer at this stage of manufacture. Assembly article 10 is disposed above the top surface of wafer 46 so that the lower surface 18 of the dielectric sheet 14 faces downwardly, towards the top or contact-bearing surfaces of the chips.

A perforated, chip engaging lower vacuum platen 54 is disposed beneath the wafer 46, and the wafer is held to the platen by vacuum applied through ports 56. Assembly article 10 is likewise held in engagement with a top platen 58. Top platen 58 includes a transparent plate 60, preferably formed from quartz, surrounded by a metal ring 62, and similar vacuum ports (not shown) on its lower surface. Assembly article 10 is sealingly engaged with top platen, as by an o-ring (not shown) engaged between the circular frame 22 of the article and ring 62. Vacuum is applied through a port 64 to the space between the component and platen 60, thus engaging the assembly article firmly with the platen.

Figure 4:
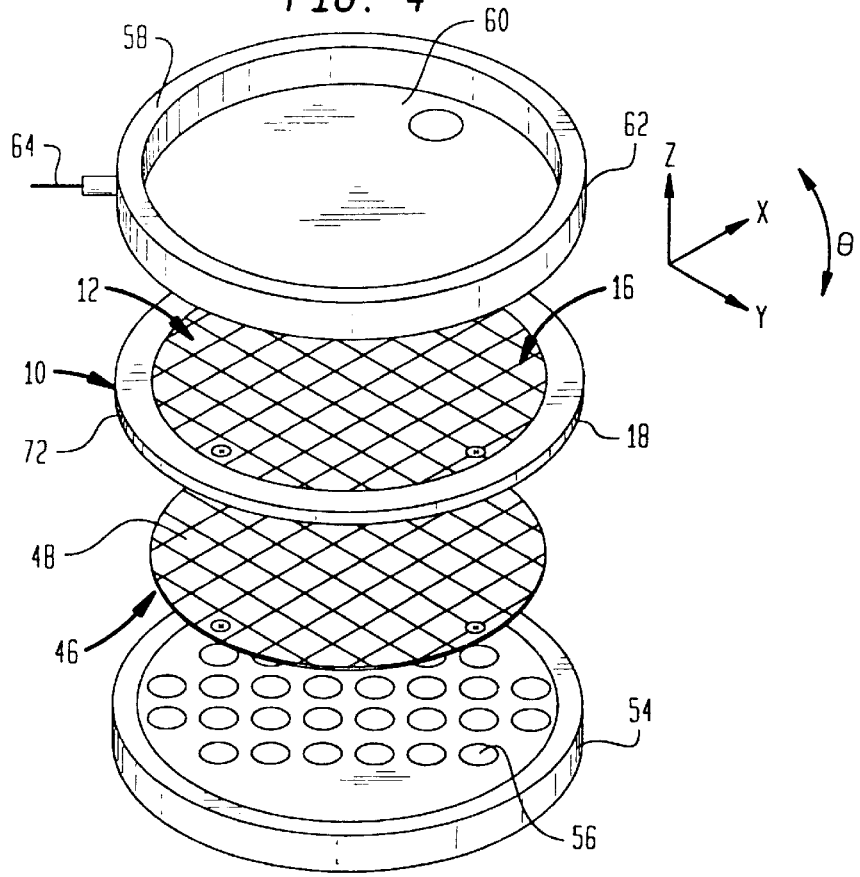
FIG. 4 is a diagrammatic, prospective view depicting the article of FIGS. 1–3 in conjunction with a wafer and comments of an assembly equipment during one stage of a process in accordance with an embodiment of the invention.

While assembly article 10 and wafer 46 are engaged with the top and bottom platens, the assembly article 10 is brought into registration with the wafer 46 by moving one or both of platens 58 and 54 in the horizontal or X-Y directions and also by rotating one of the platens about a vertical axis, so as to swing the article 10 and wafer 46 relative to one another in the azimuthal directions indicated by the arrow theta in FIG. 4. These motions can be controlled using micrometer screw adjusting devices (not shown). During this process, the position of article 10 relative to the wafer can be gauged by observing fiducial marks 44 on assembly article and similar fiducial marks on the wafer. Inasmuch as the dielectric film 14 of the assembly article is transparent, the top surface of wafer 46 can be seen through the top platen 58 and through the film. The relative positions of the assembly article and wafer can be detected either by a human observer or by a machine-vision system.

The assembly article 10 is precisely aligned with the wafer so that each connection component 12 constituting the assembly article is precisely aligned with the corresponding chip 48. The bond region or tip end 32 of each lead 27 is aligned with the correct contact 50 on the wafer. This precise alignment can be achieved even over a relatively large assembly article incorporating numerous connection components, covering essentially the entire wafer. For example, the wafer and component may be about 10–30 cm in diameter. Even over this large area, however, the tip ends of the leads may be aligned with the contacts with the required precision.

Several factors contribute to such precise alignment. Because the dielectric film 14 is continuously held taut throughout the lead-forming process and the aligning process by the same frame 22, the leads remain in position. Also, the tip ends 32 of the leads are secured to the film by buttons 38 (FIG. 3) at all times from the time the leads are formed up to and including the alignment process. Therefore, the tip ends cannot move relative to the film. Moreover, frame 22 desirably has a coefficient of thermal expansion close to that of the wafer. Variations in temperature during the alignment process, and during subsequent steps discussed below, will not tend to move the film or leads relative to the wafer. Also, because the fiducial marks 44 are made in the same etching and plating processes as used to form the leads, the fiducial marks are in precise registration with the leads.

While the component and chip are maintained in precise alignment, the platens are moved toward one another to juxtapose the assembly article 10, and hence the connection components, closely with the wafer. Compressed gas is admitted between the top platen 58 and the sheet 14 of the assembly article so that the compressed gas bears on the top surface of sheet 14 as depicted by the arrows in FIG. 6. This biases the sheet downwardly towards the wafer so that the bonding material 40 at the tip end or bond region 32 of each lead is engaged with the aligned contact 50. The pressurized gas achieves intimate contact between the bonding material at the tip ends of the leads, over the entire surface of the wafer despite any non-planarity of the assembly article or of the wafer, without applying undesirably high localized stress at any point.

While the gas pressure is maintained, the assembly is heated to a temperature sufficient to activate the bonding material in spots, and form metallurgical bonds between the bond regions of the leads and the contacts 50 of the wafer 46. Preferably, the heating process brings the assembly to a temperature of about 240C for about 150 seconds. The tin within each spot 40 interdiffuses with the surrounding gold in the contacts 50 and in the lead itself, forming a liquid layer. This layer in turn continues to dissolve gold from the contacts and from the leads. With increasing gold content, the solidus temperature of the composition rises. At this point, the bond solidifies. The bonding process continues with an annealing step at a temperature sufficient to permit substantial interdiffusion between gold and tin, typically about 180C for about 10 minutes, so as to further enrich the bond with gold and further strengthen the bond. During this entire process, the tip ends 32 of the lead remain connected to the lower surface 18 of the dielectric sheet 14 by buttons 80. Thus, the tip ends cannot move out of position during the bonding process.

As wafer 46 and assembly article 10 are heated during the bonding process, the dielectric sheet 14 and potential plane layer 25 tend to expand at a rate greater than the rate of expansion of the wafer. However, because the dielectric sheet and potential plane are held under tension by frame 22, the thermal expansion of the dielectric sheet and potential plane layer are substantially taken up in relieving the tensile stress. The actual movement of features on sheet 14 due to thermal expansion is approximately equal to the thermal expansion of frame 22. Frame 22, in turn, has a coefficient of thermal expansion substantially equal to that of wafter 46. Therefore, the features of the assembly article and connection components, including the bond regions of the leads, remain in alignment with the features of the wafer during the heating process. At this stage of the process, in the condition illustrated in FIG. 6, each lead 27 has its terminal end 28 securely bonded to a first element of the assembly, i.e., dielectric sheet 14 and has its bond region securely bonded to a second element of the assembly, namely, wafer 46. In the next stage of the process, Vacuum is applied through the holes in both platens, thereby holding component the dielectric sheet 14 of the assembly article 10 firmly against upper platen 60, and holding wafer 46 against lower platen 54. The platens are then moved relative to one another by moving one or both of the platens so that platens 60 and 54 move vertically away from one another. Thus, the wafer or second element moves vertically away from the dielectric sheet or first element 14, in the direction indicated by the arrow $V_1$.

At the same time, a fluid, such as a curable, liquid elastomer 70 (FIG. 7) is introduced under pressure between sheet 14 and wafer 46. The fluid desirably is adapted to wet the surfaces of the wafer and the dielectric sheet, so that surface tension aids in introducing the fluid between the parts. The fluid flows around all of the leads and completely fills the space between the wafer and the dielectric sheet. The pressure exerted by the fluid after filling further assures that all portions of the sheet and wafer move away from one another and closely abut the platens. To facilitate this process, a seal, such as an O-ring (not shown) may be provided between frame 22 at the periphery of sheet 14 and wafer 46 or lower platen 54. The fluid desirably is selected so that it will form a compliant material such as an elastomer upon cure. Suitable materials include curable silicone such as the curable silicone sold under the trademark DOW 577 silicone by the Dow Corning Corporation of Midland, Mich. and other curable silicones available from Shin-Etsu Silicones of America, Inc. After injecting the flowable material, the same is cured in place. Depending upon the formulation of the flowable material, such curing may occur spontaneously at room temperature or else may require exposure to heat or other radiant energy. A typical cure cycle for the aforementioned silicone material requires about 160C for about 20 minutes.

During the vertical movement, each lead bends from a original, substantially horizontal, curved shape to vertically extensive shapes. This action is best appreciated with reference to FIGS. 8 and 9. As seen in FIG. 8, the curved section 30 of each lead is substantially horizontal but curved in a horizontal direction. That is, the curve section 30 of each lead deviates from the imaginary straight line 72 connecting the bond region 32 of such lead and the terminal section 28 of the lead. In the particular row illustrated in FIG. 8, all of the leads are curved in the direction of the positive X-axis. In other rows, the leads may be curved in the X or Y directions. However, the curved section does not have any substantial extent in the vertical or Z-axis. The curved section 30 of each lead initially has a horizontal dimension $D_y$ in the lengthwise direction, i.e., the direction transverse to the direction of curvature. As discussed above, all of the leads maintain this original, undeformed shape during the bonding step, until the bond region 32 of each lead is secured to a contact 50 on the wafer. During movement of the platens, when the dielectric sheet and wafer move away from one another, the bond region 32 of each lead is pulled downwardly by the attached contact of the wafer. The button 38 of each lead becomes detached from the dielectric sheet, freeing the bond region for such downward movement. The terminal region 28 of each lead however, remains attached to the dielectric sheet. Thus, the terminal regions move upwardly relative to the bond region and the bond regions move downwardly relative to the terminal regions as indicated by the vertical arrows in FIG. 8.

Figure 7:
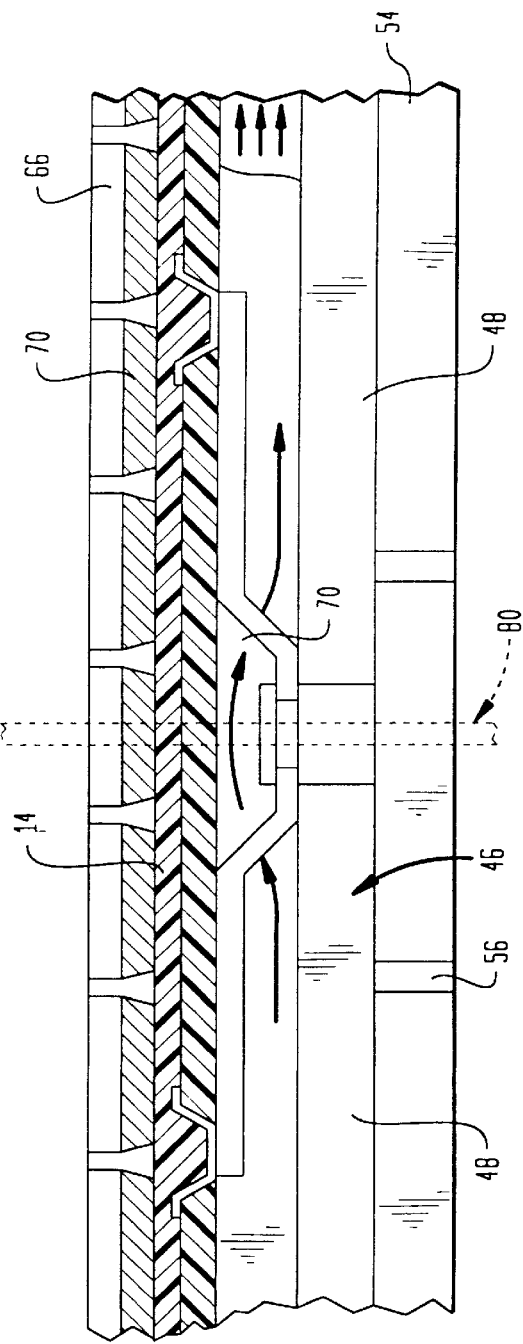
FIG. 7 is a view similar to FIG. 6 but depicting the components in later stage of the same process.

This vertical movement brings each lead to the bent condition illustrated in FIG. 7 and shown in greater detail in FIG. 9. In this condition, the horizontal, lengthwise offset $D_y$ remains the same as in the undeformed condition, but the bond region 32 is offset in the negative Z direction relative to the terminal region 28 of the lead by a vertical offset distance $D_z$ equal to the amount of vertical movement. Thus, the distance along the imaginary straight line 74' connecting the bond region to the terminal region in the deformed state is greater than the corresponding distance along line 72; the difference in straight-line distance is $(D_z^2+D_y^2)^{1/2}-D_y$. Stated another way, the curved section stretches in the lengthwise direction during the vertical movement. To accommodate such lengthwise stretching, the curved section of each lead deforms in the direction opposite to its original curvature, as indicated by arrows C in FIG. 8. Most preferably however, such movement does not entirely straighten all of the original curvature in the lead. That is, even in the deformed condition, as illustrated in FIG. 9, the curved section of the leads still has some horizontal offset $D_{x'}$ or deviation from the straight line 74.

As discussed above with reference to FIG. 2, each connection component, and hence the assembly article as a whole, includes leads curved in different directions. The forces exerted through each of these leads during the straightening process, tend to counteract one another so that neither the wafer nor the dielectric sheet is pulled or twisted horizontally during the process.

Figure 10:
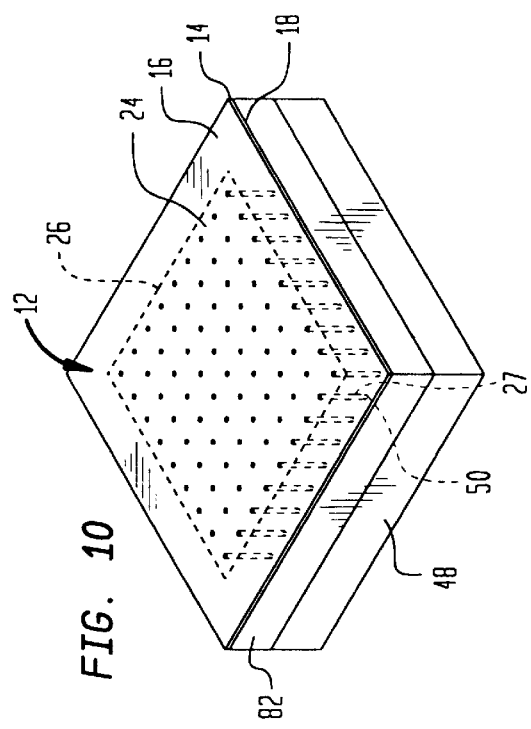
FIG. 10 is a diagrammatic, perspective view of the assembly made from the components of FIGS. 1–9.

After the injected elastomer has been cured, the dielectric sheet, elastomer and wafer are removed from the platens and severed as by sawing, along the borders between the adjacent chips 48 and hence along the empty gutters or margins 51 between adjacent chips of the wafer. These gutters or margins correspond to the boundaries 20 between individual connection components 12 of the assembly article 10. The position of the saw kerf 80 is schematically illustrated in FIG. 7. The resulting microelectronic component assembly (FIG. 10) includes a microelectronic component or chip 48, an individual connection component 12. Dielectric sheet 14 of the connection component is spaced apart from the front or contact-bearing surface of the chip, and a layer 82 of compliant dielectric material is disposed therebetween. Each contact 50 of the chip is connected to one of the terminals 24 of the connection component by a lead 27. All of the leads 27, and all of the contacts 50 are fully encapsulated by the compliant layer 82. The horizontal dimensions of the assembly are substantially the same as those of the chip itself. That is, all of terminals 24 are disposed within central region 26, i.e, the region overlying the front surface of the chip itself and overlying the area of the front surface bounded by the contacts 50 on the chip. The assembly thus is in accordance with the teachings of the aforementioned U.S. Pat. No. 5,148,265. It provides a "fan-in" lead arrangement and also permits movement of the terminals 24 and chip 48 both in the horizontal directions and in the vertical direction towards and away from the chip. The assembly can be bonded to a larger substrate, with each individual terminal 24 connected to a contact pad of the substrate by conventional bonding processes such as solder bonding, eutectic bonding or the like. The terminals can move in horizontal directions parallel to the chip surface to compensate for differential thermal expansion of the chip and substrate. The vertical compliance of the terminals, towards and away from the chip, facilitates testing of the chip assembly prior to assembly with the substrate. Thus, all of the terminals can be engaged simultaneously by a test fixture; any non-planarity of the terminals or of the test fixture is compensated by deformation of the compliant layer and vertical movement of the terminal. The vertical compliance also facilitates engagement of the terminals with the contact pads of the substrate during the bonding process.

Figure 11:
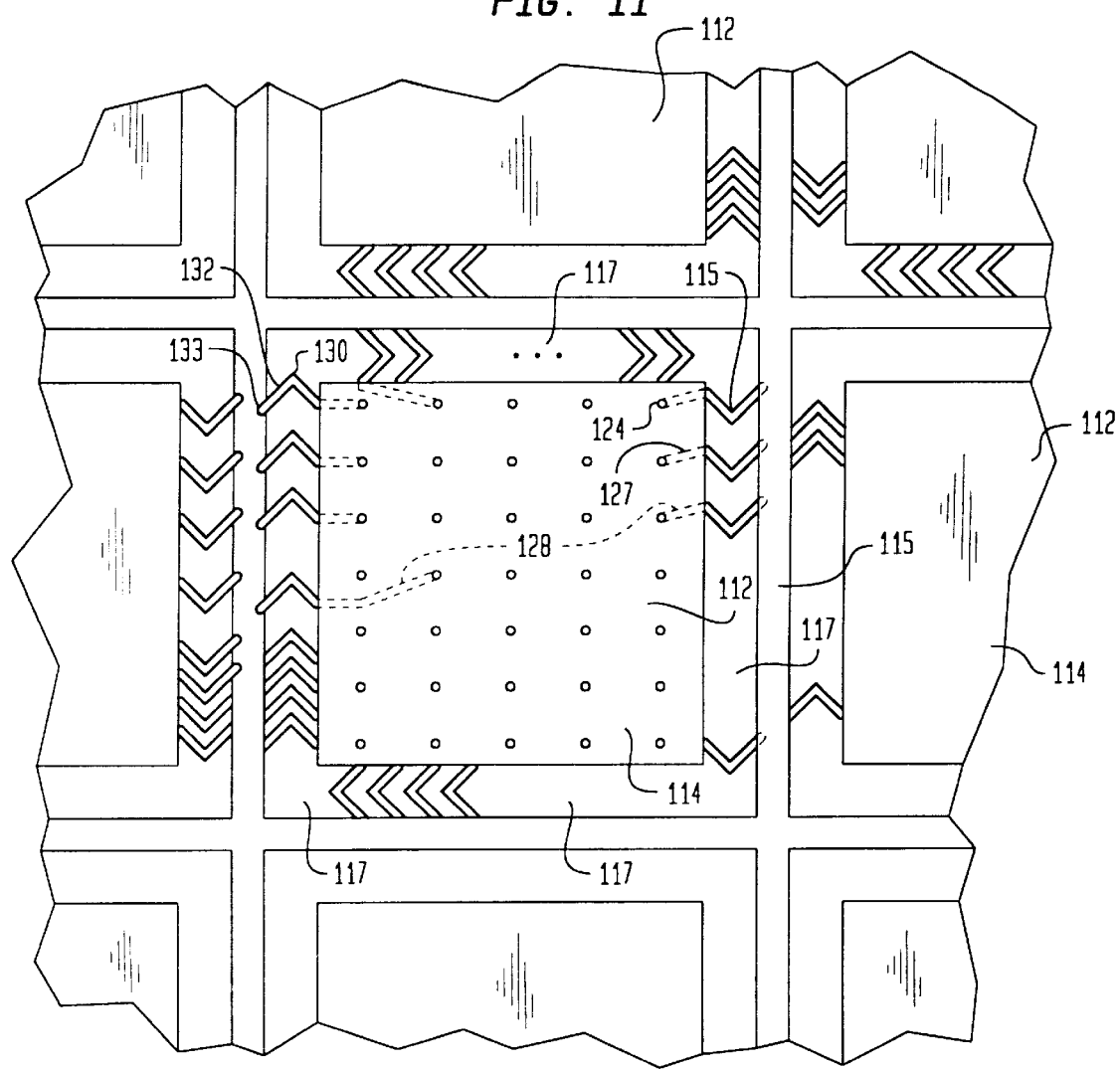
FIG. 11 is a fragmentary top plan view depicting an article in accordance with a further embodiment of the invention.

A portion of an assembly article in accordance with a further embodiment of the invention is illustrated in FIG. 11. The article of FIG. 11 includes numerous support structures 112 disposed in a common plane, these support structures each incorporating portions of a common dielectric sheet 114. Support structures 112 however are not contiguous with one another. Rather, the support structures are spaced apart from one another and positioned in rectilinear grid pattern. Strips 115 formed from the same dielectric sheet extend between each pair of mutually adjacent support structures 112, so that four strips encircle each support structure. Four slots 117 encircle each support structure 112, the slots 117 being positioned between the support structure and the strips 115. The slots are continuous with one another and define a rectangular, loop-like bond window entirely surrounding the support structure 112. Each connection component has terminals 124 exposed on the top surface of its support structure and leads 127 extending along the bottom surface of the support structure. Each such lead, as in the arrangements discussed above, includes a terminal section 128 extending along the bottom surface of the support structure (the surface hidden from view in FIG. 11) and connected to one of the terminals 124. Each lead also includes a curved section 130 and a bond region 132. Here again, all of the curved regions are disposed in rows. In this arrangement, each bond section 132 is not disposed at the tip of the lead. Rather, the lead extends slightly beyond the bond section to the tip 133.

The curved sections, bond regions and tips of the leads are disposed in rows. The tips 133 of the leads in each row are bonded to a common strip 115, whereas the bond region 132 and curved section 130 are disposed in alignment with a slot 117. Stated another way, the curved section and bond region of each lead protrude outwardly from the margins of the support structure 112 and are exposed to the top surface of the support structure. The bond region may be disposed within the curved region 130. However, at least a portion of the curved region should be disposed between the bond region and the terminal region 128 of the lead.

An assembly article according to this embodiment of the invention can be used in a process similar to that discussed above. However, in this process, the bond region of each lead is bonded to the terminal of the chip by a bonding tool inserted through slot 117 from the top surface of the dielectric sheet. Also, after bonding, a continuous temporary sheet (not shown) is fixed to the support structures by selectively applied adhesive or other similar means, but if not attached to the strips 115. After attachment of the temporary sheet, the assembly is handled in substantially the same way as discussed above. Thus, it is engaged between platens, vacuum is applied and the continuous sheet, with support structures 112 attached thereto, is lifted upwardly, away from the wafer. In this operation, strips 115 remain in their original position juxtaposed with the front surface of the chip. During or after the lifting operation, a liquid curable material is introduced as discussed above and cured. The resulting assembly is then severed to form individual chip assemblies similar to those discussed above.

Figure 12:
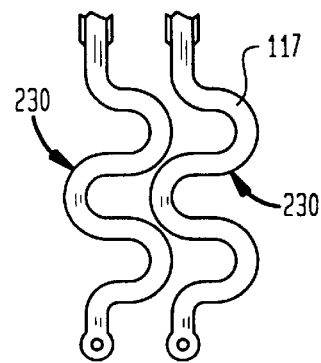
FIG. 12 is a fragmentary plan view depicting portions of an article in accordance with yet another embodiment of the invention.

Numerous additional variations and combinations of the features discussed above can be utilized without departing from the present invention as defined by the claims. For example, the leads illustrated in FIG. 12 each include curved sections 230 defining a plurality of bights, each such bight including smooth, generally sinusoidal curves, rather than the sharp-cornered curves of the arrangements discussed above. Also, greater or fewer numbers of leads, disposed in greater or fewer number of rows, can be employed. In the processes discussed above, the assembly article incorporates numerous support structures for numerous individual connection components, and all of the leads for all of the connection components are deformed in a single movement step. However, the connection components can be provided as individual units and assembled to individual, separate chips, so that the leads of each connection component are bonded to the contacts of the associated chip in a separate operation. Individual connection components can be supplied in the form of a continuous tape. As further discussed in the aforementioned '768 application, the wafer can be replaced by an assemblage made from separate chips juxtaposed generally edge-to-edge with one another, with the contact-bearing surfaces of the various chips desirably disposed in a common plane. Such an assemblage may include all of the same chips or numerous different chips and may include spaces between adjacent chips. Also, the severing step discussed above can be modified so as to leave several chips attached to a single, larger connection component. Such a connection component may include one or more layers of traces or leads extending along the dielectric film for interconnecting various bonds of the chips with one another.

Essentially any bonding material capable of bonding the bond region of the lead to the contact of the chip can be used. For example, a eutectic bonding material may include other metals adapted to form a low-melting eutectic with the material of the lead such as germanium and silicone in addition to or as alternatives to tin in bonding material for use with gold leads. Bonding materials suitable for other processes, such as diffusion bonding without formation of a liquid phase, may be employed. Also, the bonding material may be or may include a solder or a metal-bearing polymeric composition. Further, bonding methods which do not require a distinct bonding material may be employed as, for example, thermosonic and thermalcompression bonding of the lead connection sections to the contacts. Embodiments such as that illustrated in FIG. 11 wherein at least the bond region of each lead is exposed to the top surface for access by bonding tool are particularly preferred for use with such methods. The lead may include materials other than gold, such as silver, copper and brass, whereas metals other than copper and nickel can be used for formation of the terminals, conductive layers and via liners. As these and other variations and combinations of the features discussed above can be utilized without departing from the present invention, the foregoing description should be taken by way of illustration rather than by way of limitation of the present invention as defined by the claims.

What is claimed is:

1. A connection component for a microelectronic element, the connection component comprising: a sheetlike support structure having top and bottom surfaces extending in horizontal directions, the support structure having a central region and a periphery surrounding the central region, terminals mounted on the central region of the support structure and exposed at said top surface, and a plurality of leads extending on said support structure, each said lead having a terminal section connected to one said terminal and attached to said bottom surface, a bond region and a horizontally-curved section between the bond region and the terminal region, said bond sections of said leads being disposed side-by-side in one or more rows adjacent the periphery of the support structure, the connection component further including means for supporting each said lead adjacent the bond region thereof so that after bonding of said bond regions of said leads to contacts of a microelectronic element, the support structure of the connection component can be moved upwardly to bend the curved sections of the leads.

2. A connection component as claimed in claim 1 wherein each lead is detachably connected to said support structure adjacent the bond region thereof, said means for supporting including such detachable connection.

3. An assembly article including a plurality of connection components as claimed in claim 1, the support structures of said connection components incorporating portions of a unitary dielectric sheet.

4. A connection component as claimed in claim 1 wherein said means for supporting includes at least one securement element extending alongside the support structure, each such securement element being vertically movable with respect to the support structure, each said lead being attached to one said securement element adjacent the bond region of the lead.

5. A component as claimed in claim 4 wherein each said securement element is spaced apart from the support structure so as to define an elongated slot therebetween, the bond regions of the leads in each row being disposed in alignment with one said slot.

6. An assembly article including a plurality of connection components as claimed in claim 4, the support structures of said connection components being substantially coplanar with one another, said securement elements being elongated strips extending between adjacent support structures so that leads from two adjacent connection components are attached to each said strip, whereby the support structure of said connection components are attached to one another at least in part through said leads and securement elements.

* * * * *

UNITED STATES PATENT AND TRADEMARK OFFICE
CERTIFICATE OF CORRECTION

PATENT NO. : 5,959,354
DATED : September 28, 1999
INVENTOR(S) : Smith, et al.

It is certified that error appears in the above-identified patent and that said Letters Patent is hereby corrected as shown below:

Column 1, line 8, "836" should read -- 830 --.

Column 1, line 11, "no" should read -- now --.

Column 10, line 62, "o-ring" should read -- O-ring --.

Signed and Sealed this

Eighteenth Day of July, 2000

Attest:

Attesting Officer

Q. TODD DICKINSON
Director of Patents and Trademarks

UNITED STATES PATENT AND TRADEMARK OFFICE
CERTIFICATE OF CORRECTION

PATENT NO. : 5,959,354
DATED : September 28, 1999
INVENTOR(S) : Smith, et al.

It is certified that error appears in the above-identified patent and that said Letters Patent is hereby corrected as shown below:

Column 2, line 43, take out the paragraph after "terminals".
Column 11, line 64, "240C" should read - - 240° C - - .

Column 12, line 6, "180C" should read - - 180° C - - .

Column 12, line 63, "160C" should read - - 160° C - -.

Signed and Sealed this

Twelfth Day of September, 2000

Attest:

Q. TODD DICKINSON

*Attesting Officer*   *Director of Patents and Trademarks*